(12) United States Patent
Kando et al.

(10) Patent No.: US 8,099,853 B2
(45) Date of Patent: Jan. 24, 2012

(54) METHOD FOR MANUFACTURING BOUNDARY ACOUSTIC WAVE DEVICE

(75) Inventors: Hajime Kando, Ritto (JP); Naohiro Nodake, Kanazawa (JP); Masahiko Saeki, Kanazawa (JP); Toshiyuki Fuyutsume, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 223 days.

(21) Appl. No.: 12/504,843

(22) Filed: Jul. 17, 2009

(65) Prior Publication Data

US 2009/0265904 A1 Oct. 29, 2009

Related U.S. Application Data

(63) Continuation of application No. PCT/JP2007/074919, filed on Dec. 26, 2007.

(30) Foreign Application Priority Data

Jan. 19, 2007 (JP) ................................. 2007-009855

(51) Int. Cl.
*H04R 31/00* (2006.01)

(52) U.S. Cl. .......... 29/594; 29/25.35; 29/595; 29/609.1; 205/199; 205/122; 310/366; 310/320; 333/150; 333/187; 333/193; 333/195; 333/196

(58) Field of Classification Search .............. 29/25.35, 29/594, 595, 609.1; 205/119, 122; 310/313, 310/320, 366; 333/150, 187, 193, 195, 196
See application file for complete search history.

(56) References Cited

U.S. PATENT DOCUMENTS

| 6,046,656 | A | 4/2000 | Mishima |
| 7,464,457 | B2 * | 12/2008 | Le et al. ............. 29/603.16 |
| 7,486,001 | B2 * | 2/2009 | Kando ................. 310/313 R |
| 2005/0099091 | A1 | 5/2005 | Mishima et al. |
| 2006/0071579 | A1 | 4/2006 | Kando |
| 2007/0096592 | A1 | 5/2007 | Kadota et al. |
| 2009/0115287 | A1 | 5/2009 | Kando |

FOREIGN PATENT DOCUMENTS

| JP | 10-84246 A | 3/1998 |
| JP | 2004-159262 A | 6/2004 |
| JP | 2005-80202 A | 3/2005 |
| JP | 2005-150915 A | 6/2005 |
| JP | 2006-254507 A | 9/2006 |
| JP | 2006-270608 A | 10/2006 |
| WO | 2006/114930 A1 | 11/2006 |

OTHER PUBLICATIONS

Official Communication issued in corresponding Japanese Patent Application No. 2008-553993, mailed on Dec. 21, 2010.
Official Communication issued in International Patent Application No. PCT/JP2007/074919, mailed on Mar. 25, 2008.

* cited by examiner

*Primary Examiner* — Paul D Kim
(74) *Attorney, Agent, or Firm* — Keating & Bennett, LLP

(57) ABSTRACT

A method for manufacturing a boundary acoustic wave device prevents formation of discontinuous portions in a dielectric film without a significant decrease in the thickness of an IDT when the dielectric film is formed by deposition and without deterioration of electrical characteristics. The method includes the steps of forming an IDT on a piezoelectric substrate, forming a lower dielectric film so as to cover the IDT, conducting a planarizing step so as to smooth the rough surface of the lower dielectric film, and forming an upper dielectric film so as to cover the lower dielectric film of which the rough surface is smoothed.

9 Claims, 7 Drawing Sheets

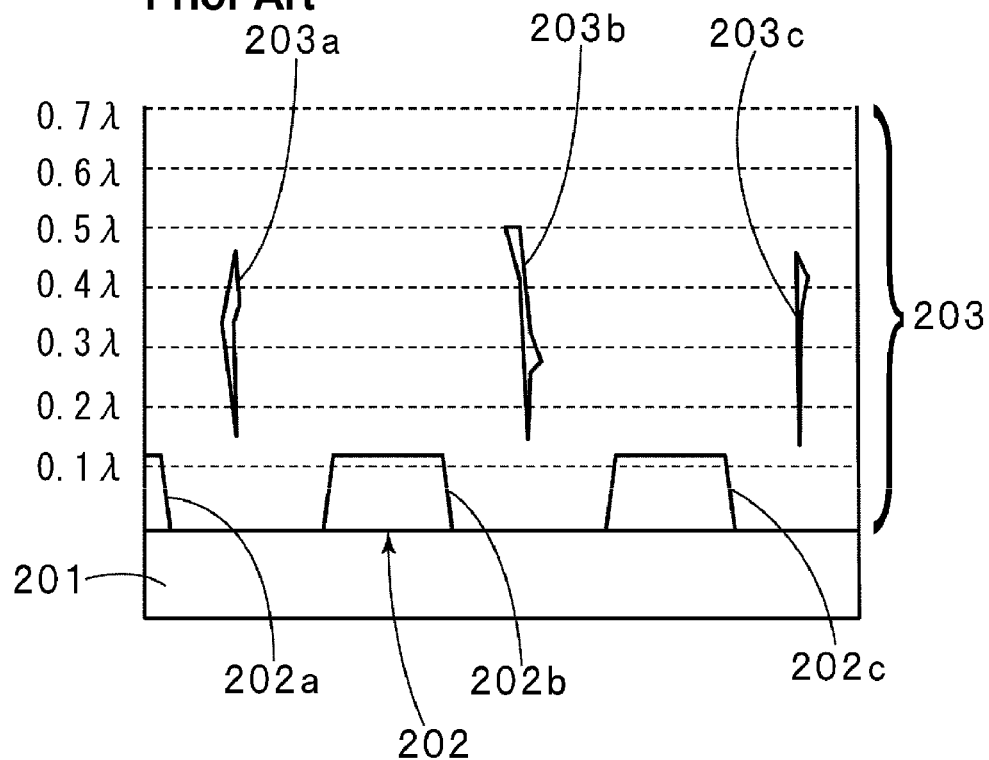

METHOD FOR MANUFACTURING BOUNDARY ACOUSTIC WAVE DEVICE

BACKGROUND OF THE INVENTION

1. Field of the Invention

The present invention relates to a method for manufacturing a boundary acoustic wave device, for use in a resonator or a band-pass filter, for example. More specifically, the present invention relates to a method for manufacturing a boundary acoustic wave device having a structure in which a film unevenness of a dielectric substance is improved.

2. Description of the Related Art

Surface acoustic wave devices are widely used for band-pass filters of cellular phones or the like. On the other hand, instead of such surface acoustic wave devices, boundary acoustic wave devices have been studied for simplifying and downsizing of a package structure.

WO2004/070946 discloses one example of a method for manufacturing a boundary acoustic wave device. In the manufacturing method described in WO2004/070946, first, an electrode including an IDT is formed on a piezoelectric substrate composed of $LiNbO_3$ or the like by photolithography. Subsequently, a dielectric film composed of, for example, $SiO_2$, is formed by a deposition method such as sputtering, vapor deposition, or CVD so as to cover the IDT. In the thus-obtained boundary acoustic wave device, a boundary acoustic wave is excited by the IDT at a boundary between the piezoelectric substrate and the dielectric film and propagates through the boundary.

The IDT includes a plurality of electrode fingers and there are spaces between the electrode fingers where the electrode is not present. Therefore, there is a difference in height between the region where the electrode is present and the region such as the spaces where the electrode is not present. When the dielectric film is formed by the deposition method, the dielectric film tends to grow in a tilted manner or an uneven dielectric film tends to be formed by the difference in height between the region where the electrode is present and the region where the electrode is not present. As a result, the characteristics of the obtained boundary acoustic wave device may deteriorate.

To solve the problems described above, WO2004/070946 describes that decreasing of the thickness of the electrode such as the IDT is effective. Specifically, it is described that, assuming that a wavelength of a boundary acoustic wave is denoted by $\lambda$, the thickness H of the IDT is preferably $0.1\lambda$ or less.

However, even if the thickness of the IDT is about $0.1\lambda$ as described in WO2004/070946, elastic discontinuous portions tend to be formed in the dielectric film at centers of the spaces between the electrode fingers. This will be described with reference to FIGS. 10 and 11.

FIGS. 10 and 11 are schematic front sectional views showing the presence of elastic discontinuous portions in a $SiO_2$ film when a boundary acoustic wave device is manufactured in accordance with the following specifications.

a) Specifications of the Boundary Acoustic Wave Device Shown in FIG. 10

An IDT with $\lambda=3.6$ μm, thickness=$0.103\lambda$, and duty=0.6 was formed on a $LiNbO_3$ substrate. A $SiO_2$ film having a thickness of 6 μm was further formed by RF magnetron sputtering.

As evident from FIG. 10, an IDT 102 is disposed on a $LiNbO_3$ substrate 101. The IDT 102 includes electrode fingers 102a and 102b. A $SiO_2$ film 103 is formed so as to cover the IDT 102. An elastic discontinuous portion 103a is created in the $SiO_2$ film 103. The elastic discontinuous portion 103a is positioned above the center of a space between the electrode fingers 102a and 102b. The elastic discontinuous portion 103a is present at a position of $0.18\lambda$ to $0.348\lambda$ above the upper surface of the $LiNbO_3$ substrate. The elastic discontinuous portion 103a is believed to be formed by the collision between the $SiO_2$ film deposited on an electrode finger 102a side and the $SiO_2$ film deposited on an electrode finger 102b side at the center of the space, when the $SiO_2$ film is formed by deposition.

The presence of the elastic discontinuous portion 103a may deteriorate the electrical characteristics of the boundary acoustic wave device when a boundary acoustic wave is excited.

Specifically, the presence of the elastic discontinuous portion 103a may provide a boundary acoustic wave with an uneven acoustic velocity and deteriorate the electromechanical conversion efficiency provided by the IDT 102. Consequently, an electromechanical coefficient may decrease or a propagation loss or a frequency variation may increase.

b) Specifications of the Boundary Acoustic Wave Device Shown in FIG. 11

An IDT with $\lambda=1.6$ μm, thickness=$0.113\lambda$, and duty=0.5 was formed on a $LiNbO_3$ substrate 201. A $SiO_2$ film 203 having a thickness of 6 μm was further formed.

In this case, elastic discontinuous portions 203a to 203c are created in the $SiO_2$ film above the spaces between electrode fingers 202a and 202b, between electrode fingers 202b and 202c, and between an electrode finger 202c and an outer electrode finger (not shown), respectively.

The elastic discontinuous portions 203a to 203c are present at the position between $0.15\lambda$ and $0.46\lambda$ to $0.5\lambda$ above the upper surface of the $LiNbO_3$ substrate 201.

As shown in FIGS. 10 and 11, even if the thickness of the IDT is set to be about $0.103\lambda$ or $0.113\lambda$, the large elastic discontinuous portions 103a and 203a to 203c are created in the $SiO_2$ film, which may deteriorate the electrical characteristics of the boundary acoustic wave device.

As described in WO2004/070946, if the thickness of the IDT is set to be $0.1\lambda$ or less, that is, the thickness is further decreased, the effect due to the thickness of the IDT can be suppressed. However, if the thickness of the IDT is excessively decreased, an electrical resistance is increased or a sufficiently large electromechanical coefficient cannot be achieved.

SUMMARY OF THE INVENTION

Preferred embodiments of the present invention provide a method for manufacturing a boundary acoustic wave device that solves the problems of existing technologies and includes a step of forming a dielectric film by deposition. In the method, the creation of elastic discontinuous portions in a dielectric film is effectively and reliably prevented without a significant decrease in the thickness of an IDT.

According to a preferred embodiment of the present invention, a method for manufacturing a boundary acoustic wave device includes forming an IDT on an upper surface of a piezoelectric substrate; forming a lower dielectric film by deposition so as to cover the IDT; planarizing to smooth a rough surface of the lower dielectric film; and forming an upper dielectric film on the lower dielectric film so as to cover the lower dielectric film of which the rough surface is smoothed.

According to another preferred embodiment of the present invention, a method for manufacturing a boundary acoustic wave device includes forming a thickness-adjusting dielectric film for reducing a difference in thickness between an IDT and a lower dielectric film, on an upper surface of a dielectric substrate; forming a resist pattern in which a region where the IDT is to be formed is an opening, on the thickness-adjusting dielectric film; etching the thickness-adjusting dielectric film using the resist pattern as a mask; forming a metal film for forming the IDT; forming IDT electrodes by removing the resist film together with the metal film on the resist film while leaving the thickness-adjusting dielectric film in spaces between the IDT electrodes; forming the lower dielectric film by deposition so as to cover a region where the IDT and the thickness-adjusting dielectric film remain; planarizing to smooth a rough surface of the lower dielectric film; and forming the upper dielectric film so as to cover the upper surface of the lower dielectric film.

In this specification, a deposition method means a method for forming a film by depositing a medium material. The deposition method broadly includes methods for forming a film by depositing a medium material, such as sputtering, vapor deposition, and CVD, for example, and other suitable processes.

In the planarizing step, a resist layer whose upper surface is planar is preferably formed on the lower dielectric film and then uniformly etched from an upper surface of the resist layer, whereby the lower dielectric film is planarized by smoothing a rough surface of the lower dielectric film. In this case, by simply forming a resist layer whose upper surface is planar and uniformly etching the resist layer, the rough surfaces of the lower dielectric film are easily smoothed and the upper surface can be planarized. As a result, the thickness control of the lower dielectric film is greatly improved.

The planarizing step of planarizing the lower dielectric film may preferably include polishing the upper surface of the lower dielectric film. By using a polishing method, the upper surface of the lower dielectric film can be planarized to the same level as the surface of a mother wafer for forming the piezoelectric substrate.

The planarizing step is preferably conducted such that, assuming that a wavelength of a boundary acoustic wave excited by the IDT is denoted by $\lambda$, a portion having a distance of about $0.4\lambda$ or less, for example, between an upper surface of the piezoelectric substrate and the upper surface of the lower dielectric film is disposed in a region where the lower dielectric film is to be positioned on the IDT after the planarizing step. The elastic discontinuous portions are present at a position of about $0.4\lambda$ or less, for example, above the upper surface of the IDT. Thus, in the case where a portion having a distance of about $0.4\lambda$ or less, for example, between the upper surface of the piezoelectric substrate and the upper surface of the lower dielectric film is disposed, at least a portion of the elastic discontinuous portions is removed even if the elastic discontinuous portions are created in the portion. Accordingly, the characteristics of a boundary acoustic wave device are effectively and reliably prevented from deteriorating.

In the manufacturing method according to a preferred embodiment of the present invention, each of the step of forming the lower dielectric film and the planarizing step may be conducted more than once. In this case also, by conducting the planarizing step more than once, a lower dielectric film whose upper surface is planar is stacked and an even upper dielectric film can be formed above the lower dielectric film.

In a preferred embodiment of the present invention, when the IDT includes a plurality of electrode fingers and the lower dielectric film is formed such that elastic discontinuous portions are not created in the lower dielectric film in spaces between the plurality of electrode fingers, such elastic discontinuous portions are not created in the lower dielectric film. Accordingly, the deterioration of electrical characteristics due to the presence of the elastic discontinuous portions is prevented.

In the method for manufacturing a boundary acoustic wave device according to a preferred embodiment of the present invention, the lower dielectric film is formed preferably so as to cover the IDT and the rough surface of the lower dielectric film is then smoothed through the planarizing step. When the upper dielectric film is formed by deposition so as to cover the lower dielectric film of which the rough surface is smoothed, the discontinuous portions described above are not easily created in the upper dielectric film. Thus, even if the lower dielectric film and the upper dielectric film are formed by deposition without a significant decrease in the thickness of the IDT, the electrical characteristics of a boundary acoustic wave device do not easily deteriorate.

In a preferred embodiment of the present invention, after the thickness-adjusting dielectric film for reducing the difference in thickness between the IDT and the lower dielectric film is disposed in the spaces between the electrode fingers of the IDT, the lower dielectric film is formed by deposition so as to cover the region where the IDT and the thickness-adjusting dielectric film remain. Thus, the difference in height between the region where the electrodes of the IDT are present and the spaces is decreased by forming the thickness-adjusting dielectric film. Consequently, the discontinuous portions in the lower dielectric film are prevented. In addition, after the rough surface of the lower dielectric film is further smoothed through the planarizing step, the upper dielectric film is formed, whereby the discontinuous portions are not significantly created in the upper dielectric film.

Accordingly, the creation of the discontinuous portions in the dielectric film can be effectively and reliably prevented without a significant decrease in the thickness of the IDT, and the deterioration of the electrical characteristics of a boundary acoustic wave device can be prevented.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 11 is a schematic front sectional view for describing discontinuous portions in a dielectric film of a boundary acoustic wave device obtained by a method for manufacturing an existing boundary acoustic wave device.

DETAILED DESCRIPTION OF THE PREFERRED EMBODIMENTS

Preferred embodiments of the present invention will now be described with reference to drawings to clarify the present invention.

A manufacturing method according to a first preferred embodiment of the present invention will be described with reference to FIGS. 1A to 1D, 2A to 2D, 3A, and 3B.

Figure 1A:
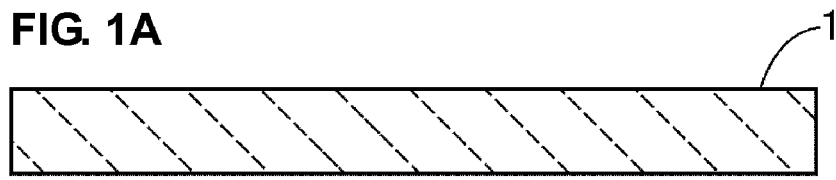
FIGS. 1A to 1D are schematic front sectional views for describing a method for manufacturing a boundary acoustic wave device according to a first preferred embodiment of the present invention.

In the method for manufacturing a boundary acoustic wave device according to this preferred embodiment, a piezoelectric substrate 1 is prepared first as shown in FIG. 1A. In this preferred embodiment, the piezoelectric substrate 1 preferably is composed of 15° Y-cut X-propagation $LiNbO_3$, for example. However, other materials may be used to form the substrate 1.

Figure 1B:
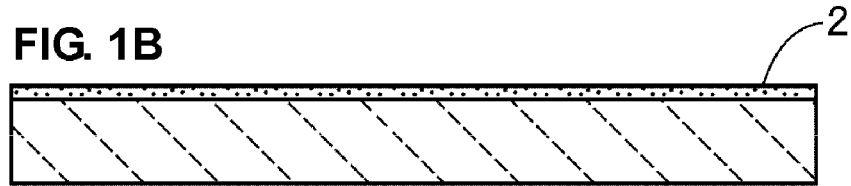

As shown in FIG. 1B, a thickness-adjusting dielectric film 2 is then formed on the piezoelectric substrate 1 by sputtering, for example. The thickness-adjusting dielectric film 2 is made of $SiO_2$. The sputtering is conducted using Ar gas and $O_2$ gas at a film formation temperature of approximately 200° C. at a gas pressure of about 0.3 Pa, for example. The thickness-adjusting dielectric film 2 preferably has a thickness of about 100 nm, for example.

Figure 1C:
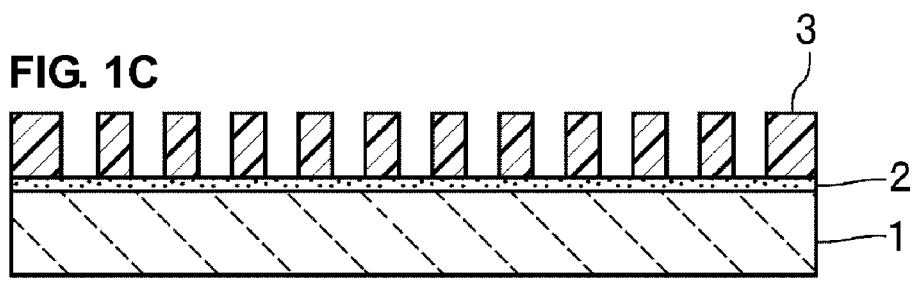
Figure 1D:
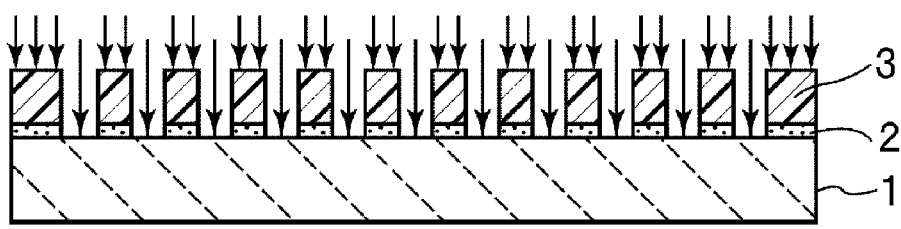

Subsequently, a photoresist layer is formed on the entire thickness-adjusting dielectric film 2 and patterned by photolithography. Thus, a resist pattern 3 is formed as shown in FIG. 1C. In the resist pattern 3, an IDT is formed in the openings. The thickness-adjusting dielectric film 2 is etched using the resist pattern 3 as a mask. In other words, as shown in FIG. 1D, the thickness-adjusting dielectric film 2 is removed by etching in the region where the thickness-adjusting dielectric film 2 is not covered with the resist pattern 3. This etching is conducted by reactive ion etching (RIE) or dry etching, for example.

Figure 2A:
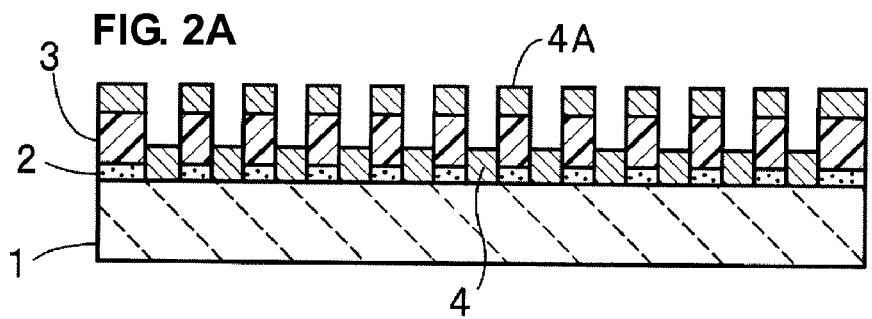
FIGS. 2A to 2D are schematic front sectional views for describing the method for manufacturing a boundary acoustic wave device according to the first preferred embodiment of the present invention.

As shown in FIG. 2A, a metal film for entirely forming the IDT is formed by vapor deposition. As shown in FIG. 2A, the metal film is deposited in the openings of the resist pattern 3 to form an IDT 4. A metal film 4A is also formed on the resist pattern 3.

A pair of reflectors are formed together with the IDT 4 on both sides of the IDT. In this preferred embodiment, a one-port type boundary acoustic wave resonator is preferably produced by disposing a pair of reflectors on both sides of the IDT 4. The IDT includes a plurality of electrode fingers. The IDT preferably has 50 pairs of electrode fingers and each of the reflectors has 51 electrode fingers, for example. The wavelength λ according to the electrode finger period of the IDT and reflectors preferably is about 3.42 μm and the duty preferably is about 0.5, for example. In the IDT, the electrode finger cross width is preferably weighted so as to be about 35λ at the center of the IDT and about 12λ at both ends of the IDT in the propagation direction of a boundary acoustic wave, for example. The distance between the centers of electrode fingers of the IDT and one of the reflectors preferably is about 0.5λ, for example.

The IDT is formed by stacking a plurality of metal films using sputtering. Specifically, the metal films NiCr/Ti/Al/Ti/Ni/Au/Ni/Ti respectively having approximate thicknesses of 20/10/100/10/10/140/5/10 nm, for example, are stacked in that sequence from the top.

Figure 2B:
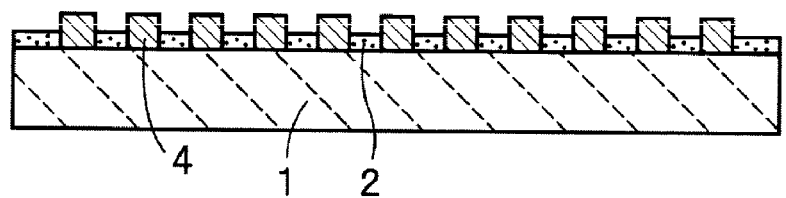

The resist pattern 3 and the metal film 4A stacked on the resist pattern 3 are then removed by liftoff method. Thus, as shown in FIG. 2B, the IDT 4 is formed and the thickness-adjusting dielectric film 2 is provided in the region where the IDT 4 is not present.

The presence of the thickness-adjusting dielectric film 2 decreases the difference in height between the region where the IDT 4 is formed and the region where the IDT 4 is not formed, that is, the spaces between electrode fingers.

Figure 2C:
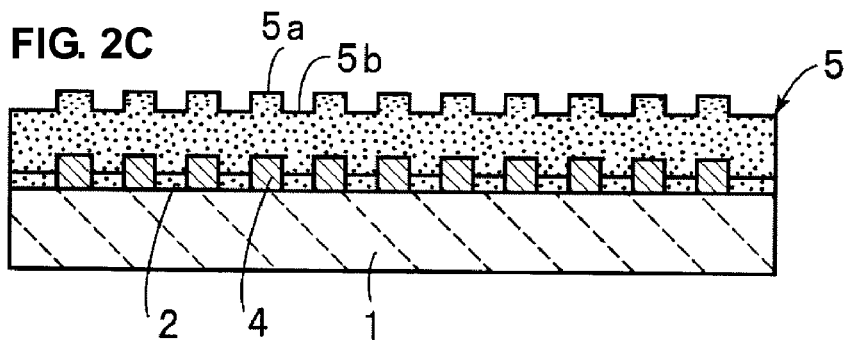

As shown in FIG. 2C, a lower dielectric film 5 is formed by forming a $SiO_2$ film using sputtering. The sputtering is conducted preferably using Ar gas and $O_2$ gas at a film formation temperature of about 270° C. at a gas pressure of about 0.1 Pa to form the lower dielectric film 5 having a thickness of about 1000 nm, for example. Since the thicknesses of the IDT 4 and the thickness-adjusting dielectric film 2 that are disposed below the lower dielectric film 5 are different, the obtained lower dielectric film 5 has projections 5a and depressions 5b on its upper surface. The difference in height between the projections 5a and the depressions 5b is the difference in height between the IDT 4 and the thickness-adjusting dielectric film 2 described above. However, the difference in height between the projections 5a and the depressions 5b is decreased by the thickness of the thickness-adjusting dielectric film 2.

Figure 2D:
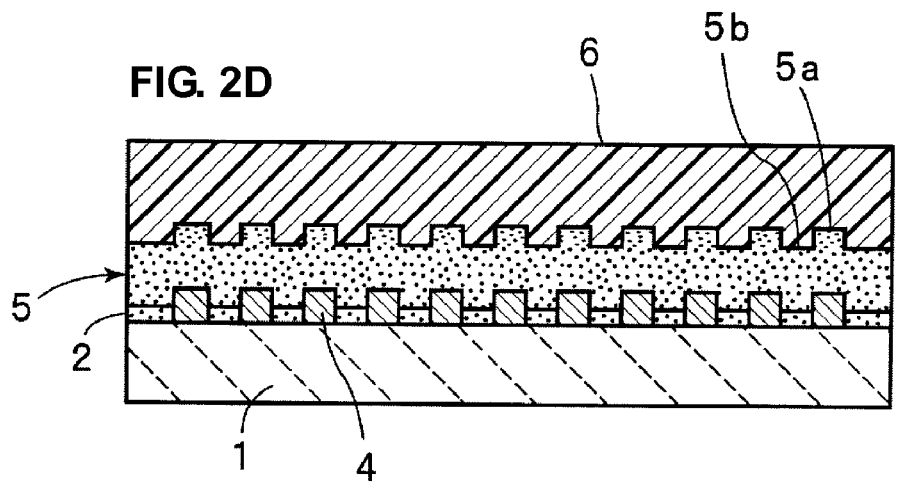
Figure 3A:
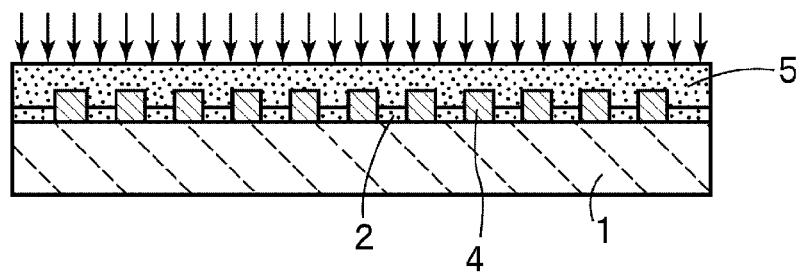
FIGS. 3A and 3B are schematic front sectional views for describing the method for manufacturing a boundary acoustic wave device according to the first preferred embodiment of the present invention.

As shown in FIG. 2D, a planarizing resist layer having a thickness of about 3000 nm is preferably formed by spin coating, for example. The upper surface of the lower dielectric film 5 is planarized while the planarizing resist layer 6 is removed by etching. This planarizing step is conducted using an etching gas. Here, an etching gas is obtained by mixing $CF_4$ and $CHF_3$. The gas pressure preferably is about 7 Pa, for example. The ratio of the etching rate of $SiO_2$ to that of the planarizing resist layer 6 preferably is about 1.02, for example. Thus, as shown in FIG. 3A, the etching is conducted by blowing the etching gas as indicated by arrows to planarize the upper surface of the lower dielectric film 5. As a result, the thickness of the lower dielectric film 5 is reduced to about 500 nm, for example.

Figure 3B:
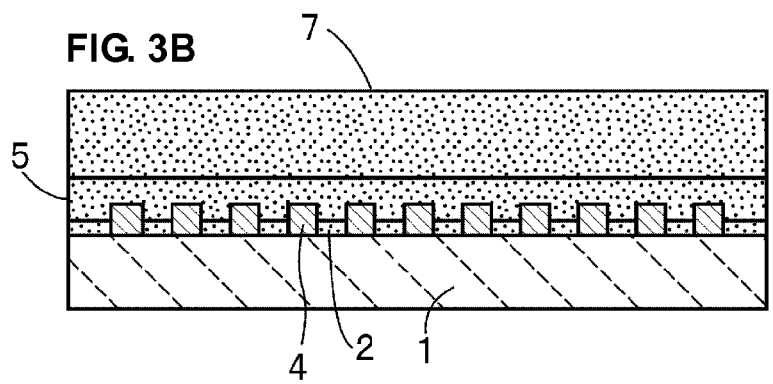

As shown in FIG. 3B, an upper dielectric film 7 is formed on the lower dielectric film 5 by sputtering. The upper dielectric film 7 is composed of $SiO_2$ and a $SiO_2$ plate is used as a target when sputtering. The sputtering gases preferably are Ar gas and $O_2$ gas. A film formation temperature preferably is about 270° C., for example. A gas pressure preferably is about 0.1 Pa, for example. Thus, the upper dielectric film 7 is formed by deposition, for example.

Figure 6:
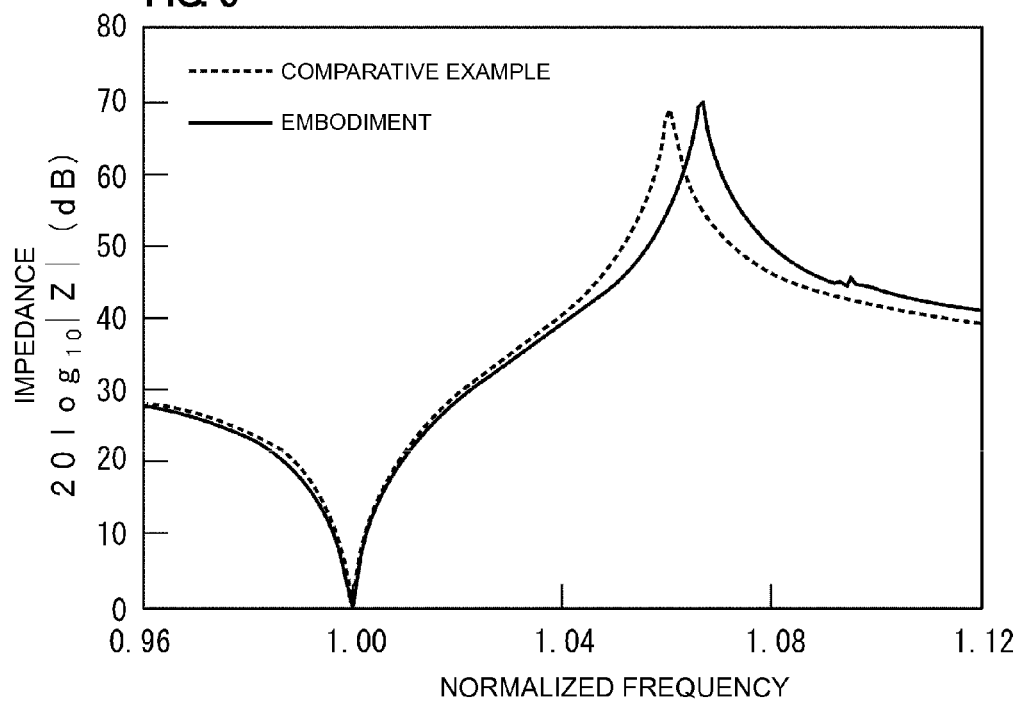
FIG. 6 is a graph showing impedance-frequency characteristics of the boundary acoustic wave devices obtained in the first preferred embodiment of the present invention and a comparative example.

The impedance-frequency characteristics of the obtained boundary acoustic wave device are shown by a solid line in FIG. 6. In FIG. 6, the horizontal axis indicates normalized frequency based on a resonant frequency and the vertical axis indicates impedance 20 $\log_{10}|Z|$ (dB). As a comparative example, a boundary acoustic wave device was manufactured in the same manner except that an upper dielectric film is formed immediately after the structure shown in FIG. 2C is obtained without conducting the formation step of the planarizing resist 6 and the planarizing step. The impedance-frequency characteristics of the boundary acoustic wave device of the comparative example are shown by a broken line in FIG. 6.

The resonant frequency Fr, the ratio (Fa−Fr)/Fr of the difference (Fa−Fr) between the anti-resonant frequency Fa and the resonant frequency Fr to the resonant frequency Fr, and the impedance Za at an anti-resonance point of the boundary acoustic wave devices obtained in the present preferred embodiment and the comparative example are shown in Table 1 below.

TABLE 1

| Item | | (Fa − Fr)/Fr [%] | Fr [MHz] | Za [dB] |
|---|---|---|---|---|
| Comparative example | Average value | 6.01 | 911.768 | 68.1 |
| | σ | 0.04 | 5.70 | 0.74 |
| Embodiment | Average value | 6.58 | 923.908 | 69.2 |
| | σ | 0.04 | 3.06 | 0.96 |

As shown in FIG. 6 and Table 1, (Fa−Fr)/Fr of the present preferred embodiment is increased compared with that of the comparative example because the planarizing resist layer 6 is formed to conduct planarizing process. Therefore, it is clear that the electromechanical conversion efficiency provided by the IDT is improved and the electromechanical coefficient can be increased.

In this preferred embodiment, the impedance Za at an anti-resonance point is higher than that of the comparative example. Thus, it is clear that the propagation loss can be reduced.

It is also apparent that the variation σ of the resonant frequency Fr is smaller than that of the comparative example. Accordingly, it is clear that the frequency variation can be reduced and the yield can be increased, which can reduce the cost of a boundary acoustic wave device.

In FIG. 3A, the upper surface of the lower dielectric film 5 is planarized through the planarizing step described above. However, FIG. 3A schematically shows the effect caused by the planarizing. In the case where the planarizing step is conducted using an etching gas, the upper surface of the lower dielectric film 5 is not always planarized completely as shown in the drawing.

Figure 4:
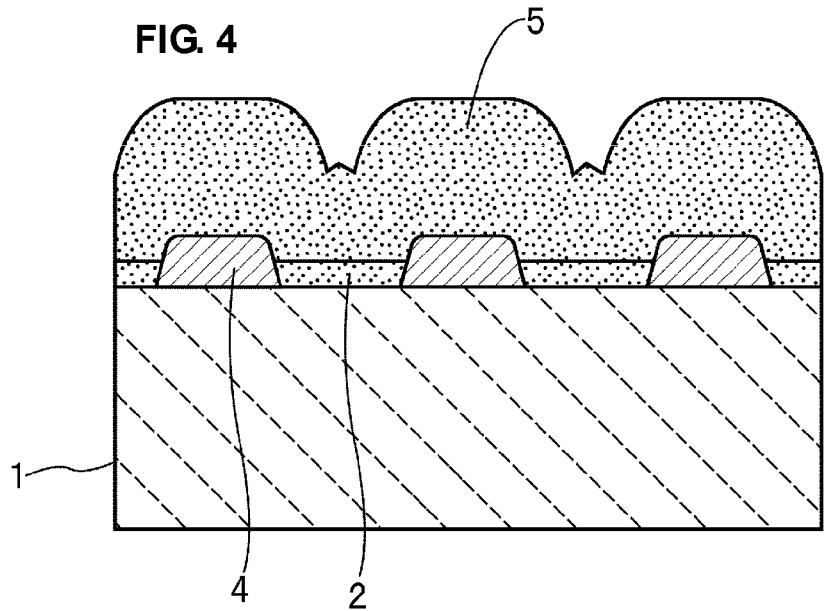
FIG. 4 is a schematic front sectional view for describing the roughness on the lower dielectric film before a planarizing step is conducted in the first preferred embodiment of the present invention.
Figure 5:
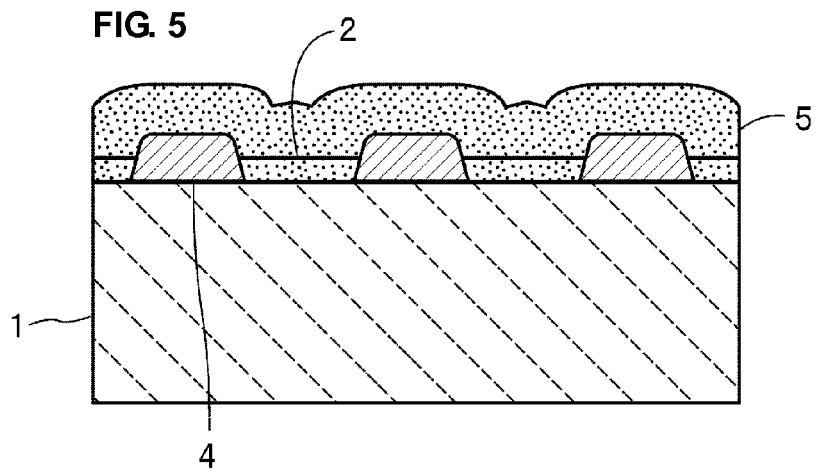
FIG. 5 is a schematic front sectional view for describing the roughness of the upper surface of the lower dielectric film after the planarizing step in the first preferred embodiment of the present invention.

Actually, there is some roughness on the upper surface of the lower dielectric film 5 after the planarizing step as shown in FIG. 5 that is a schematic enlarged sectional view. As shown in FIG. 4, the upper surface of the lower dielectric film before the planarizing step has large roughness due to the difference in height between the region where the IDT 4 is formed and the region where the IDT 4 is not formed. In contrast, as shown in FIG. 5, the upper surface of the lower dielectric film 5 can have minimal roughness by conducting the planarizing step.

The planarizing step used in various preferred embodiments of the present invention preferably includes the steps of smoothing a rough surface in a broad sense such that the surface roughness of the lower dielectric film 5 shown in FIG. 4 are changed to those in FIG. 5. Therefore, it should be pointed out that the upper surface of the lower dielectric film is not always planarized completely.

Figure 7:
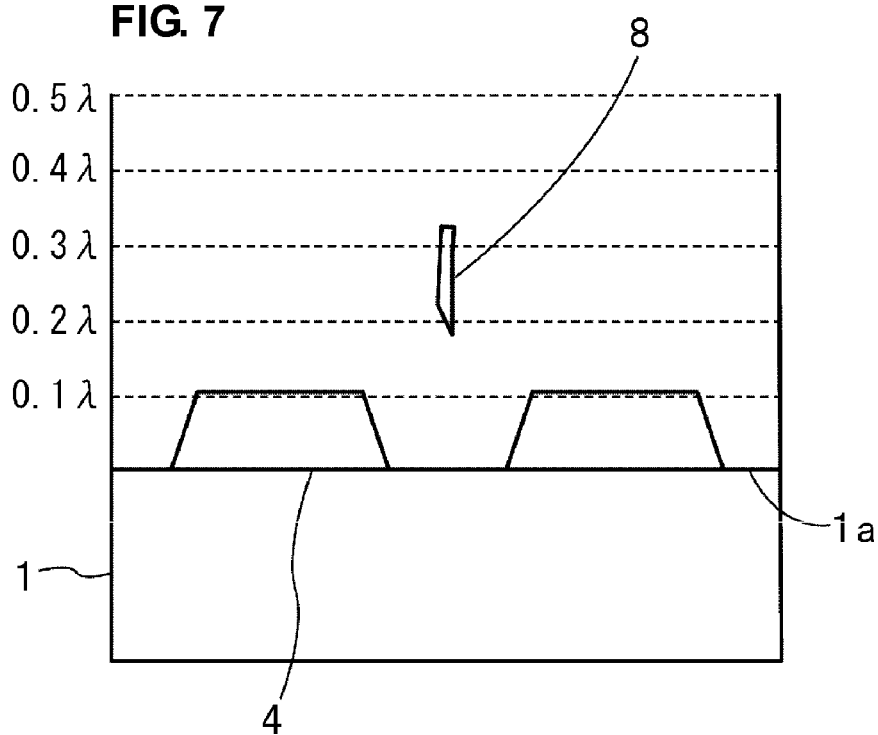
FIG. 7 is a schematic front sectional view showing the position of a discontinuous portion created in the boundary acoustic wave device obtained in the first preferred embodiment of the present invention.

Even in the present preferred embodiment, the elastic discontinuous portion described above is created in the dielectric film between the electrode fingers of the IDT. FIG. 7 is a sectional view schematically showing an elastic discontinuous portion created above a space between the electrode fingers of the IDT 4 in this preferred embodiment. In this case, an elastic discontinuous portion 8 is present at a position of, for example, about 0.18λ to about 0.32λ above the upper surface 1a of the piezoelectric substrate 1.

Figure 8:
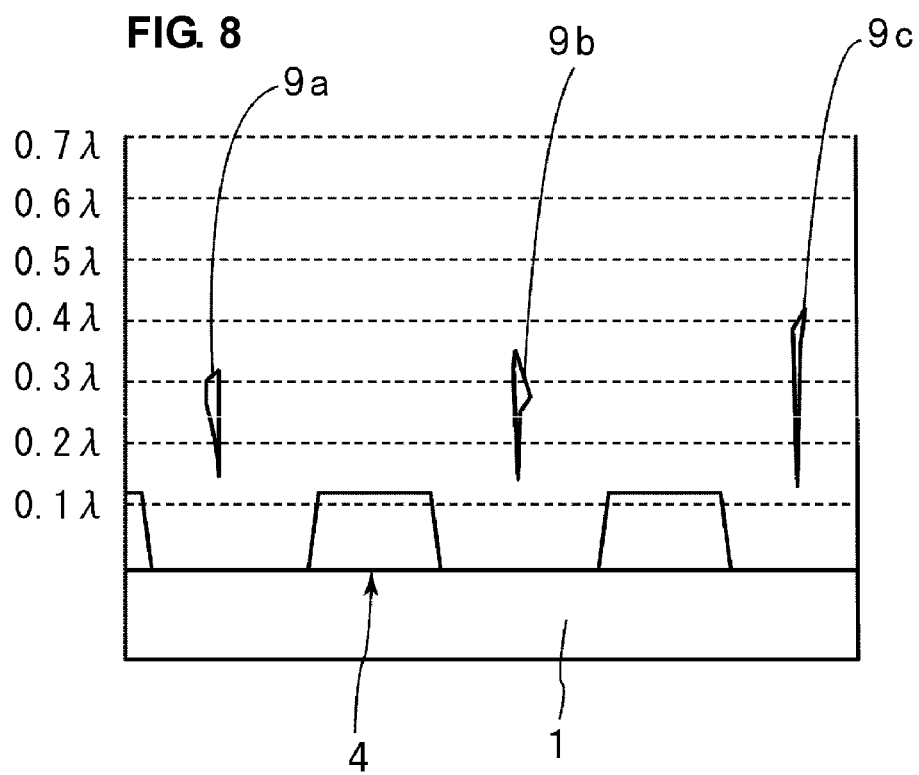
FIG. 8 is a front sectional view schematically showing the position of discontinuous portions when the thickness of the IDT is differentiated in the first preferred embodiment of the present invention.

FIG. 8 is a front sectional view schematically showing the position of discontinuous portions when a boundary acoustic wave device is manufactured in the same manner as the preferred embodiment described above except that IDT electrodes having the same thickness as those of FIG. 11 are formed. In FIG. 8, discontinuous portions 9a to 9c are present at a position of, for example, about 0.1λ to about 0.4λ above the upper surface of the piezoelectric substrate 1 at the centers between the electrode fingers that are adjacent to each other.

In the manufacturing method of this preferred embodiment, as evident from FIGS. 7 and 8, the elastic discontinuous portions are present at a position of, for example, about 0.1λ to about 0.4λ above the upper surface of the piezoelectric substrate at the centers of spaces between the electrode fingers even if the thickness of the IDT is changed to some extent. Accordingly, the lower dielectric film is preferably etched in the planarizing step such that the thickness is decreased to, for example, about 0.1λ or less above the upper surface 1a of the piezoelectric substrate 1. If the thickness is decreased to, for example, at most about 0.4λ or less, at least a portion of the elastic discontinuous portions is removed and the elastic discontinuous portions become small. As a result, it is clear that the effect due to the presence of the elastic discontinuous portions can be greatly reduced and minimized. In various preferred embodiments of the present invention, the lower dielectric film 5 is preferably etched in the planarizing step such that the upper surface of the lower dielectric film 5 is present at a position of, for example, about 0.4λ or less above the upper surface 1a of the piezoelectric substrate 1.

A manufacturing method according to a second preferred embodiment will now be described. In the second preferred embodiment, an IDT 4 and a thickness-adjusting dielectric film 2 that remain in the region where the IDT 4 is not formed are formed on a piezoelectric substrate 1 in the same manner as the first preferred embodiment.

Figure 9A:
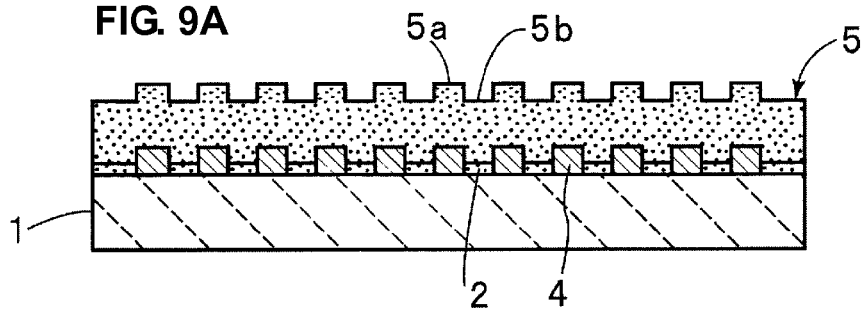
FIGS. 9A to 9C are schematic front sectional views for describing the steps in a method for manufacturing a boundary acoustic wave device according to a second preferred embodiment of the present invention.

Subsequently, as shown in FIG. 9A, a lower dielectric film 5 is entirely formed by sputtering, for example. The lower dielectric film 5 is also formed in the same manner as the first preferred embodiment using the same material as that of the first preferred embodiment.

Figure 9B:
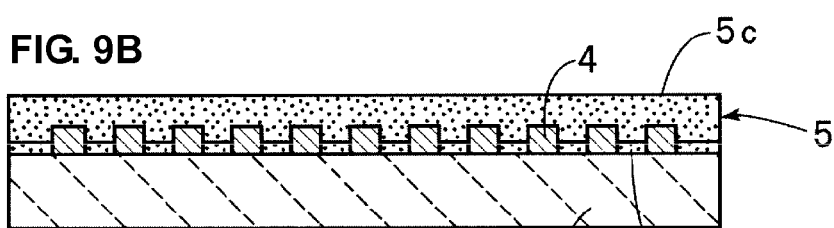

The difference between the second preferred embodiment and the first preferred embodiment is that the planarizing step is preferably conducted by chemical mechanical polishing (CMP), for example. Thus, the upper surface 5c of the lower dielectric film 5 is planarized as shown in FIG. 9B. The planarizing step may be conducted by a polishing method, such as CMP; laser processing; ion milling; or the like in addition to etching.

Figure 9C:
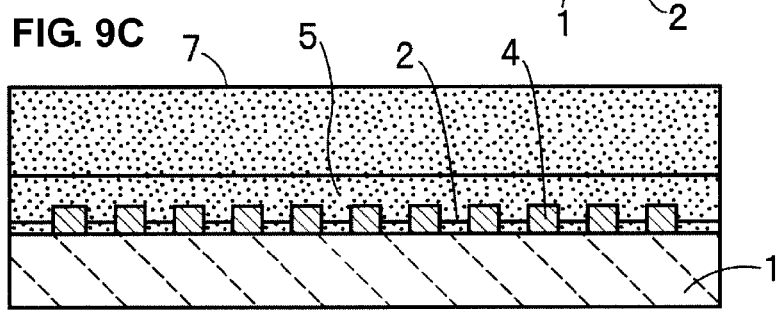
Figure 10:
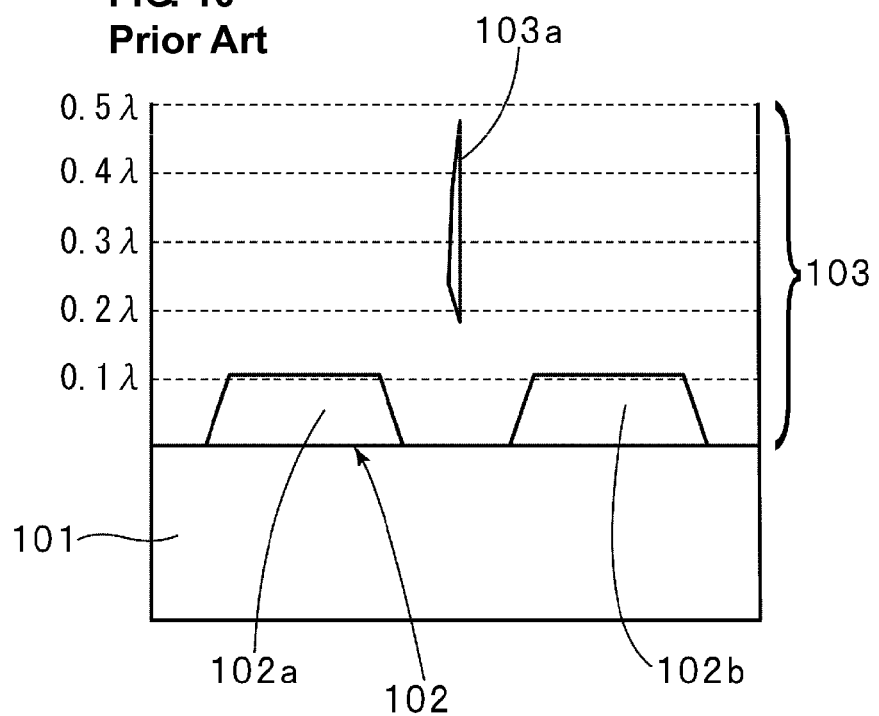
FIG. 10 is a schematic front sectional view for describing discontinuous portions in a dielectric film of a boundary acoustic wave device obtained by a method for manufacturing an existing boundary acoustic wave device.

As shown in FIG. 9C, an upper dielectric film 7 is formed on the lower dielectric film 5. The upper dielectric film 7 is formed in the same manner as the first preferred embodiment.

In the case where the lower dielectric film 5 is polished by CMP, the upper surface of the lower dielectric film 5 is planarized to the same level as the surface of a wafer for obtaining the piezoelectric substrate 1. Accordingly, the creation of the elastic discontinuous portions in the upper dielectric film 7 can be prevented with more certainty.

In the first and second preferred embodiments, a method for manufacturing a one-port type boundary acoustic wave resonator has been described. However, the method for manufacturing a boundary acoustic wave device according to the present invention is applied to not only the one-port type boundary acoustic wave resonator, but also other resonators having different structures. Alternatively, the method can be widely applied to the devices using a boundary acoustic wave such as a longitudinally coupled filter, a ladder filter, a longitudinally coupled resonator filter, a transversely coupled resonator filter, a transversal filter using a reflective SPUDT, a boundary acoustic wave optical switch, and a boundary acoustic wave optical filter, for example, and other suitable electronic components.

An electrode including the IDT may be formed with a single metal such as Al or Au, or may be composed of a stacked metal film formed by stacking a plurality of metal films. In other words, metals such as Pt, Ag, Cu, Ni, Ti, Fe, W, and Ta or an alloy film primarily composed of such metals may be stacked on Au, Al, or the like. To improve adhesion and electric power resistance, a thin metal layer composed of, for example, Ti, Cr, NiCr, Ni, Pt, or Pd in addition to Al, Au, or an alloy thereof may be disposed between another metal film and a piezoelectric substance or between another metal film and a dielectric substance as an adhesion layer or an electric power resistance improvement layer.

The piezoelectric substrate 1 may be formed with not only LiNbO$_3$ but also a suitable piezoelectric material including other piezoelectric single crystals such as LiTaO$_3$ and piezoelectric ceramic materials such as PZT.

The dielectric material constituting the lower dielectric film and the upper dielectric film is also not limited to SiO$_2$. A suitable dielectric substance such as Si$_3$N$_4$, glass, SiC, ZnO, Ta$_2$O$_5$, AlN, or Al$_2$O$_3$ can be used as the dielectric material.

Another elastic medium layer may be further stacked above the upper dielectric film.

A protective layer for improving the strength of the boundary acoustic wave device or preventing a corrosive gas from penetrating may be disposed on the upper dielectric film. Under certain circumstances, the boundary acoustic wave device of preferred embodiments of the present invention may be sealed in another package. The material of the protective layer is not specifically limited, and a synthetic resin such as polyimide or an epoxy resin; an inorganic insulating material such as titanium oxide, aluminum nitride, or aluminum oxide; or a metal such as Au, Al, or W can be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a boundary acoustic wave device comprising the steps of:
    forming an IDT on an upper surface of a piezoelectric substrate;
    forming a lower dielectric film by deposition so as to cover the IDT;
    planarizing to smooth a rough surface of the lower dielectric film; and
    forming an upper dielectric film on the lower dielectric film so as to cover the lower dielectric film of which the rough surface is smoothed; wherein
    in the planarizing step, a resist layer having a planar upper surface is formed on the lower dielectric film and then uniformly etched from an upper surface of the resist layer, whereby the lower dielectric film is planarized by smoothing the rough surface of the lower dielectric film.

2. The method according to claim 1, wherein the planarizing step includes polishing the upper surface of the lower dielectric film.

3. The method according to claim 1, wherein the planarizing step is conducted such that, assuming that a wavelength of a boundary acoustic wave excited by the IDT is denoted by $\lambda$, a portion having a distance of about 0.4$\lambda$ or less between an upper surface of the piezoelectric substrate and the upper surface of the lower dielectric film is disposed in a region where the lower dielectric film is to be positioned on the IDT after the planarizing step.

4. The method according to claim 1, wherein the IDT includes a plurality of electrode fingers, and the lower dielectric film is formed to have a thickness that is adjusted so as to prevent creation of elastic discontinuous portions where the lower dielectric film is discontinuous in a propagation direction of a boundary acoustic wave in spaces between the plurality of electrode fingers.

5. A method for manufacturing a boundary acoustic wave device comprising the steps of:
    forming a thickness-adjusting dielectric film for reducing a difference in thickness between an IDT and a lower dielectric film, on an upper surface of a piezoelectric substrate;
    forming a resist pattern in which a region where the IDT is to be formed is an opening, on the thickness-adjusting dielectric film;
    etching the thickness-adjusting dielectric film using the resist pattern as a mask;
    forming a metal film for forming the IDT;
    forming IDT electrodes by removing the resist film together with the metal film formed on the resist film while leaving the thickness-adjusting dielectric film in spaces between the IDT electrodes;
    forming the lower dielectric film by deposition so as to cover a region where the IDT and the thickness-adjusting dielectric film remain;
    planarizing to smooth a rough surface of the lower dielectric film; and
    forming the upper dielectric film so as to cover the upper surface of the lower dielectric film.

6. The method according to claim 5, wherein, in the planarizing step, a resist layer having a planar upper surface is formed on the lower dielectric film and then uniformly etched from an upper surface of the resist layer, whereby the lower dielectric film is planarized by smoothing the rough surface of the lower dielectric film.

7. The method according to claim 5, wherein the planarizing step includes polishing the upper surface of the lower dielectric film.

8. The method according to claim 5, wherein the planarizing step is conducted such that, assuming that a wavelength of a boundary acoustic wave excited by the IDT is denoted by $\lambda$, a portion having a distance of about 0.4$\lambda$ or less between the upper surface of the piezoelectric substrate and the upper surface of the lower dielectric film is disposed in a region where the lower dielectric film is to be positioned on the IDT after the planarizing step.

9. The method according to claim 5, wherein the IDT includes a plurality of electrode fingers, and the lower dielectric film is formed to have a thickness that is adjusted so as to prevent creation of elastic discontinuous portions where the lower dielectric film is discontinuous in a propagation direction of a boundary acoustic wave in spaces between the plurality of electrode fingers.

* * * * *